United States Patent [19]

Mehta et al.

[11] 4,034,357
[45] July 5, 1977

[54] PATTERNS FOR USE IN THE FIELD ACCESS PROPAGATION OF A BUBBLE LATTICE

[75] Inventors: Kay Beharat Mehta; Otto Voegeli, both of San Jose, Calif.

[73] Assignee: International Business Machines Corporation, Armonk, N.Y.

[22] Filed: Aug. 15, 1975

[21] Appl. No.: 604,978

[52] U.S. Cl. .......................................... 340/174 TF
[51] Int. Cl.² .......................................... G11C 11/02
[58] Field of Search ................. 340/144 TF, 144 SR

[56] References Cited

UNITED STATES PATENTS

| | | | |
|---|---|---|---|
| 3,503,054 | 3/1970 | Bobeck et al. | 340/174 TF |
| 3,916,395 | 10/1975 | Urai | 340/174 TF |
| 3,916,396 | 10/1975 | Kohara | 340/174 TF |

*Primary Examiner*—Marshall M. Curtis
*Attorney, Agent, or Firm*—Joseph E. Kieninger

[57] ABSTRACT

A rotating field access pattern for use in the propagation of a bubble lattice is disclosed. The pattern contains two sets of parallel oblong elements that are substantially perpendicular to each other. Four specific permalloy patterns featuring one element per one, two, two and four bubble domains are shown.

11 Claims, 9 Drawing Figures

PATTERNS FOR USE IN THE FIELD ACCESS PROPAGATION OF A BUBBLE LATTICE

1. Field of the Invention

This invention relates to propagation arrangements for magnetic bubbles in a bubble lattice and more particularly to rotating field accessed patterns.

2. Brief Description of Prior Art

Bubble domains arranged in a lattice are described in copending U.S. patent applications, Ser. Nos. 395,336 filed on Sept. 7, 1973 and 494,940 filed on Aug. 5, 1974 and assigned to the assignee of the present invention. The aforementioned applications are incorporated herewith by reference thereto. As described therein, the bubble lattice consists of a plurality of rows and columns of bubble domains which occupy a spatial arrangement which is determined to a substantial extent by the interaction between the bubbles.

Prior to this invention the only known scheme for lattice translation involved the use of current conductors to produce drive fields. This type of translation arrangement is described in the aforementioned U.S. patent application Ser. No. 494,940. While translation schemes employing current conductors have been successful and are wisely used, such translations schemes do have certain disadvantages. For example, the heat generated by power dissipation in the drive conductors causes a non-uniform temperature distribution across the bubble material. Since the material characteristics are typically temperature sensitive, the operating margins are reduced. It has also been found that bubble lattices can be translated more efficiently and at a faster rate when more conductors are used. However, increasing the number of conductors involves the use of more leads, more complicated processing and more complex packaging. In addition, fabrication defects that render a single conductor inoperative will cause the whole chip to be inoperative. As a result the chip costs are sensitive to process parameters when conductors are used.

Individual bubble domains in a single line or column of bubble domains have been translated by a propagation scheme generally known as field accessing. Field accessing modes propagation are described in the U.S. Pat. to Bobeck, Nos. 3,534,347, Bobeck et al, 3,541,543, Chen et al, 3,797,001, as well as others. The term "field access" characterizes a method which utilizes patterns of soft magnetic elements which are located on top of the domain layer. The elements are of geometries to exhibit magnetic poles in the presence of a magnetic field in the plane of the domain layer. Moreover, the elements are disposed such that poles are produced in consecutively offset patterns in response to reorientations of the in-plane field so that the domains are moved from an input to an output position along a channel defined by the elements. With the rotating in-plane field, the T and I bar, Y bar or T-X magnetically soft element geometries are commonly employed.

The field access arrangement is particularly inexpensive and reliable because vast numbers of bit locations are defined in a single photolithographic process and no external connections are employed. The on chip power dissipation in field accessing system is negligible. The power needed to operate the chip is generated in the coils that supply the rotating field. The heat generated in the coils is much easier to handle than on-chip heat.

While various permalloy patterns are in use today for isolated bubble propagation these patterns cannot be directly adapted for lattice propagation due to a variety of reasons. For example, the TI or YI bar patterns can be used only if the bubbles are at least four bubble diameters apart. The bubble separation in a lattice is around 1.3 to 2.5 bubble diameters depending upon the applied bias field. In addition, presently known field access patterns propagate a one-dimensional train of bubbles only. It is not possible to stack such propagation patterns to achieve the translation of a two-dimensional bubble lattice since the permalloy elements in one row interfere with the bubbles of the adjacent row. Also, in a bubble lattice the domains are arranged along symmetry axes oriented 60° from each other, thereby necessitating a corresponding symmetry in the permalloy translation pattern.

SUMMARY OF THE INVENTION

It is the primary object of this invention to provide an improved bubble lattice propagation mode.

It is another object of this invention to provide a lattice translation system having reduced on chip power dissipation.

It is still another object of this invention to provide a rotating field access scheme for bubble lattices.

It is still another object of this invention to provide a bubble translation scheme that is relatively insensitive to process defects.

These and other objects are accomplished by an on chip magnetic pattern that can be used with a bubble lattice for the translation thereof with the application of an external rotating in-plane field. The pattern contains two sets of oblong elements. The elements within each set are substantially parallel to each other. The elements of the first set are substantially perpendicular to the elements of the second set. Each element of the first set has one end positioned on a lattice point and the other end positioned about 0.5 lattice constant away from a different lattice point. Lattice points are defined to be the equilibrium position of the bubble centers in the lattice as determined by magnetostatic interactions between the bubble domains comprising the lattice. The lattice constant is the distance between two adjacent lattice points. The elements of the second set have one end positioned a distance of about 0.25 lattice constant from a lattice point and the other end positioned about 0.75 lattice constant from a different lattice point. All the distances referred to are in the direction of desired lattice translation. Four specific patterns are disclosed. One pattern employed one element per one bubble. Two patterns utilize one element per every two bubbles. The fourth pattern utilizes one element per every four bubbles.

Other objects of this invention will be apparent from the following detailed description, reference being made to the accompanying drawings wherein various embodiments of the invention are shown.

DESCRIPTION OF THE ILLUSTRATIVE EMBODIMENTS

Figure 1:
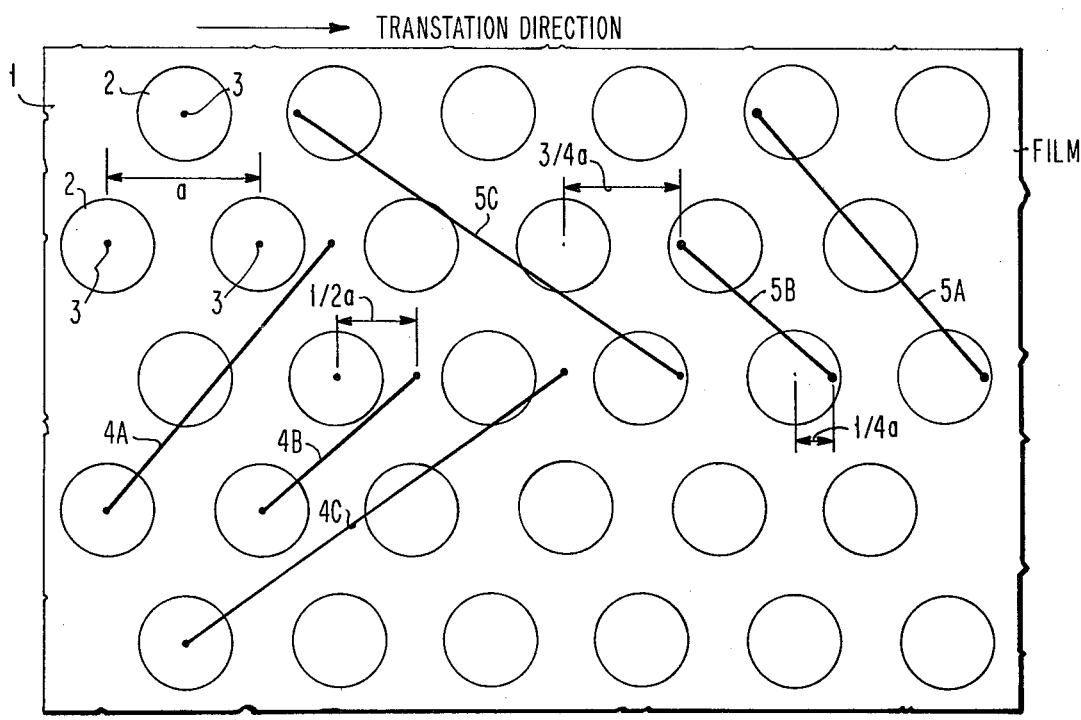
FIG. 1 is a top view showing suitable positions for drive element ends in each of the two sets comprising the field access pattern.

As shown in FIG. 1, a bubble lattice 1 contains bubble domains 2 having a center 3 which defines the lattice point of that bubble domain. The distance between the adjacent lattice points, that is, the centers 3 of two adjacent bubble domains, is the lattice constant, a. The field access pattern in accordance with this invention consists of two sets of elements. Suitable examples of elements for one set are 4A and/or 4B and/or 4C. Suitable examples of elements for the second set are 5A and/or 5B and/or 5C. The elements within each set are arranged substantially parallel to each other and are placed in a periodic pattern having an integer lattice constant periodicity such as to interact with a given fraction of all bubbles in the lattice. The elements of the first and second set are oriented substantially perpendicular to each other. The first set may consist entirely of 4A elements. It may consist solely of 4B elements or solely of 4C elements. In addition, there may be a mixture of 4A and/or 4B and/or 4C elements. Each element of the first set 4A, 4B and/or 4C have one end positioned on a lattice point and the other end positioned about 0.5 lattice constant away from a different lattice point. As shown in FIG. 1, each of the individual elements 4A, 4B and 4C satisfy the requirements even though they are different from each other. The length of element 4A is about 2.3 lattice constant and is associated with three adjacent rows. The length of element 4B is about 1.3 lattice constant and is associated with two adjacent rows. The length of element 4C is about 3.1 lattice constant and is associated with three adjacent rows.

The second set may consist entirely of elements 5A, or elements 5B or elements 5C; there may also be a mixture of 5A and/or 5B and/or 5C elements. The elements 5A and 5B and 5C have one end positioned at a distance of about 0.25 lattice constant from a lattice point and the other end positioned about 0.75 lattice constant from a different lattice point. Elements 5A are associated with three rows and of bubble domains, elements 5B are associated with two rows of bubble domains whereas elements 5C are associated with three rows of bubble domains. The length of 5A is about 2.3 lattice constant. The length of 5B is about 1.3 lattice constant. The length of element 5C is about 3.1 lattice constant.

It is understood that while all of the elements shown in FIG. 1 have ends in different rows, it is possible to have elements which have both ends in the same row and that satisfy the requirements set forth above.

Figure 2:
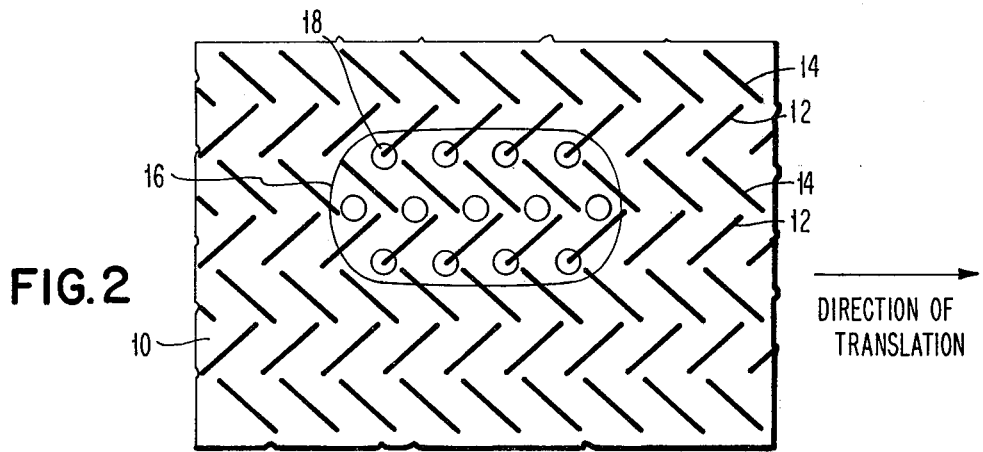
FIGS. 2 through 5 are top views of field access patterns.

AS shown in FIG. 2, a field access pattern 10 consists of a number of substantially parallel oblong elements 12. Every two rows of elements 12 are separated by a row of elements 14. The elements 14 are substantially or almost perpendicular to the oblong elements 12. The individual elements 12 in the row are aligned substantially parallel to each other. Similarly, the elements 14 in a row are aligned substantially parallel to each other. As was heretofore fully discussed, the elements may be aligned in such a manner that they are not exactly parallel to each other within a row if they meet the requirements referred to in the discussion on FIG. 1. A portion of the bubble domain lattice 16 is shown. One end of the oblong elements 12 is positioned on a lattice point. In this embodiment there is one element 12 end on every bubble in one row. The other end of oblong element 12 is positioned at a distance of about 0.5 lattice constant in the direction of translation from a lattice point in the adjacent row of bubbles. The oblong elements 14 are positioned substantially perpendicular to elements 12 so that one end of element 14 is positioned at a distance of about 0.25 lattice constant in the direction of translation from a lattice point. The other end of element 14 is positioned at a distance of about 0.75 lattice constant in the direction of translation from a lattice point in an adjacent row.

Figure 3:
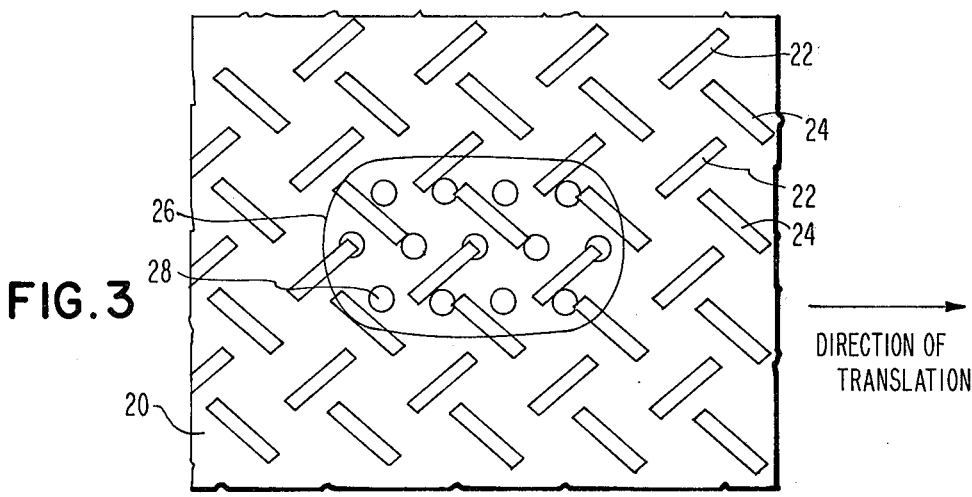

As shown in FIG. 3 a field access pattern 20 consists of a number of substantially parallel oblong elements 22. Every two rows of elements 22 are separated by a row of elements 24. The elements 24 are almost perpendicular to the oblong elements 22. The individual elements 22 in a row are aligned substantially parallel to each other. Similarly, the elements 24 in a row are aligned substantially parallel to each other. As was heretofore fully discussed, the elements may be aligned in such a manner that they are not exactly parallel to each other within a row if they meet the requirements referred to in the discussion of FIG. 1. A portion of the bubble domain lattice 26 is shown. One end of each element 22 is positioned at a lattice point. Along the translation direction, there is another lattice point between the aforementioned element 22 ends. In other-words for every two bubbles in a row, one element 22 has an end positioned at the lattice point of one of the two bubbles. The other end of the oblong element 22 is positioned in the adjacent row at a distance of about 0.5 lattice constant in the direction of translation from a lattice point. The oblong elements 24 are positioned substantially perpendicular to elements 22 so that one end of element 24 is positioned at a distance of about 0.25 lattice constant in the direction of translation from a lattice point. The other end of element 14 is positioned in the adjacent row at a distance of about 0.75 lattice constant in the direction of translation from a lattice point. In this embodiment there are two bubbles between adjacent ends of elements 24.

Figure 4:
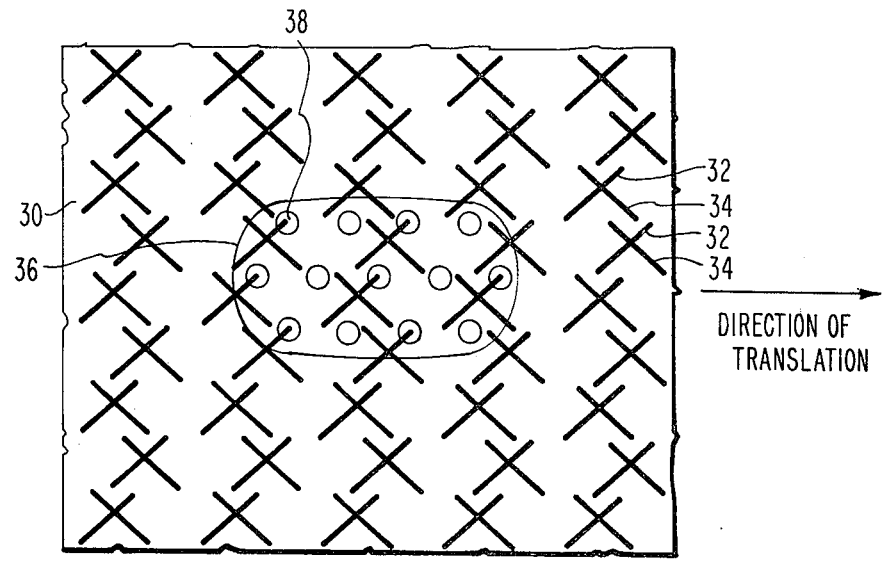

As shown in FIG. 4 a field access pattern 30 consists of a number of substantially parallel oblong elements 32. Rows of substantially parallel oblong elements 34 are substantially perpendicular to the oblong elements 32 and are positioned so that they cross elements 32. A portion of the bubble domain lattice 36 is shown. In this embodiment there is one bubble at each end of each oblong element 32 as well as one additional bubble between two of elements 32 ends. The other end of element 32 is positioned in the adjacent row at a distance of about 0.5 lattice constant in the direction of translation from a lattice point. The oblong elements 34 are positioned substantially perpendicular to elements 32 so that they cross elements 32. One end of element 34 is positioned at a distance of about 0.25 lattice constant in the direction of translation from a lattice point. The other end of element 34 is positioned in the adjacent row at a distance of about 0.75 lattice constant in the direction of translation from a lattice point in the adjacent row.

Figure 5:
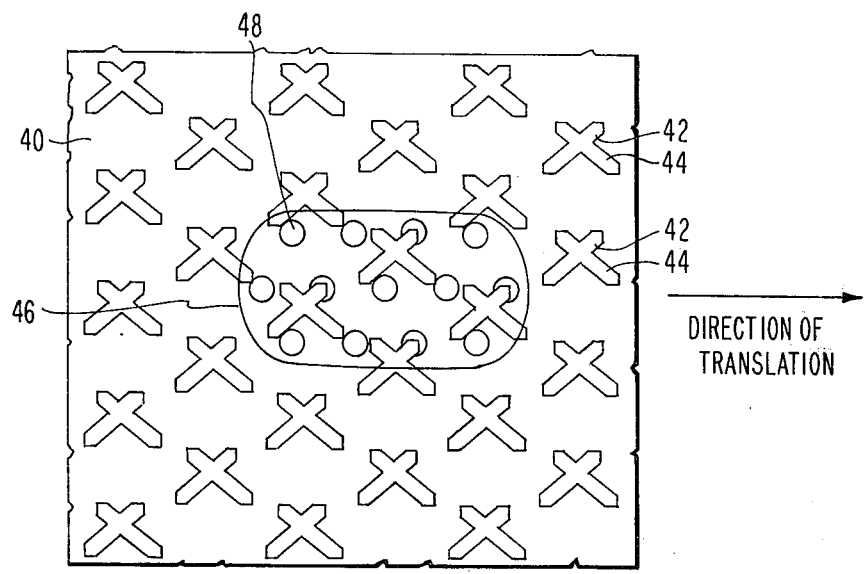

As shown in FIG. 5 a field access pattern 40 consists of a number of substantially parallel oblong elements 42. The individual elements 42 in a row are aligned substantially parallel to each other. A number of substantially parallel oblong elements 44 are positioned so that they cross the elements 42 and are substantially perpendicular thereto. A portion of the bubble domain lattice 46 is shown. One end of the elements 42 is positioned on a lattice point. In this embodiment there are along the translation direction, two lattice points between the ends of two elements 42. The other end of the oblong element 42 is positioned in the adjacent row at a distance of about 0.5 lattice constant in the direction of translation from a lattice point. The requirements for elements 44 are similar to those of element 34 in FIG. 4.

Figure 6A:
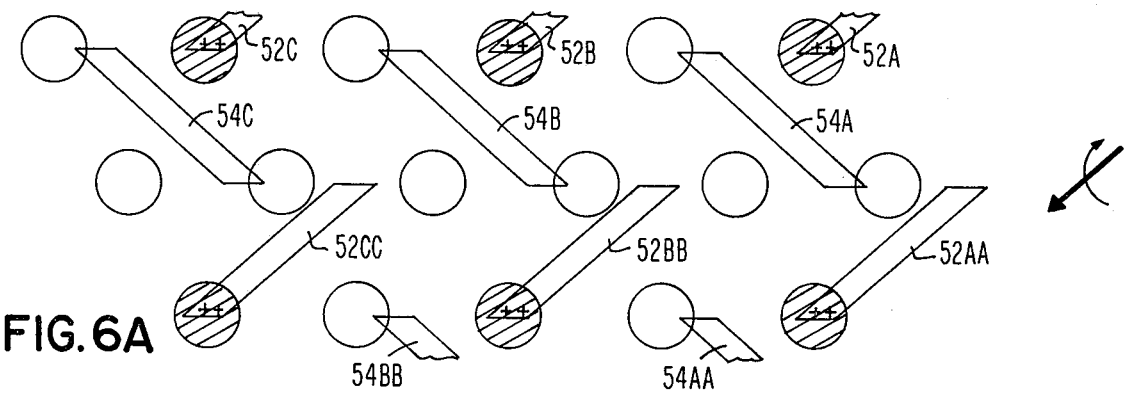
FIGS. 6a through 6d are top views of the field access pattern shown in FIG. 3, illustrating the relative lattice positions for four directions of the applied rotating drive field.
Figure 6B:
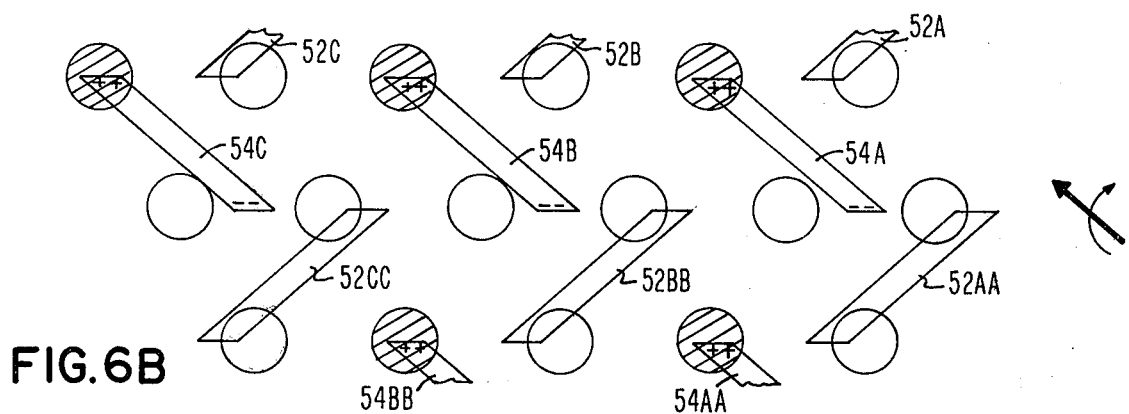
Figure 6C:
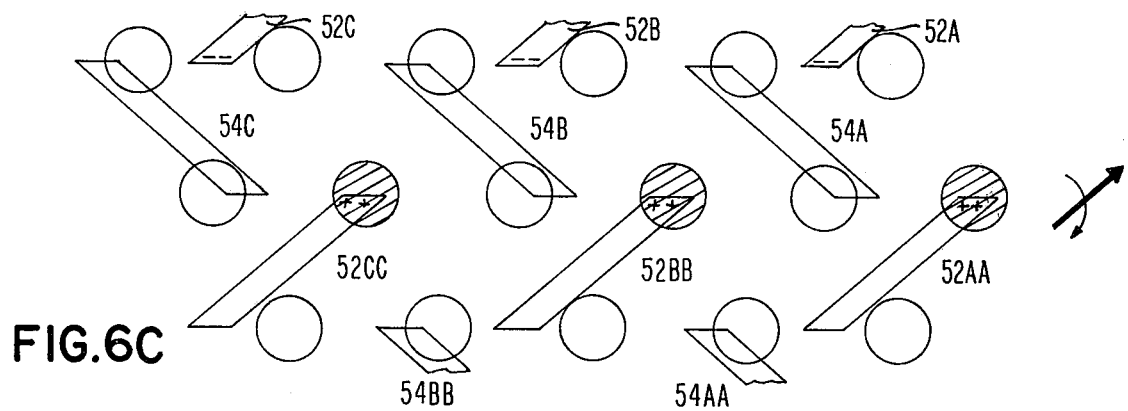
Figure 6D:
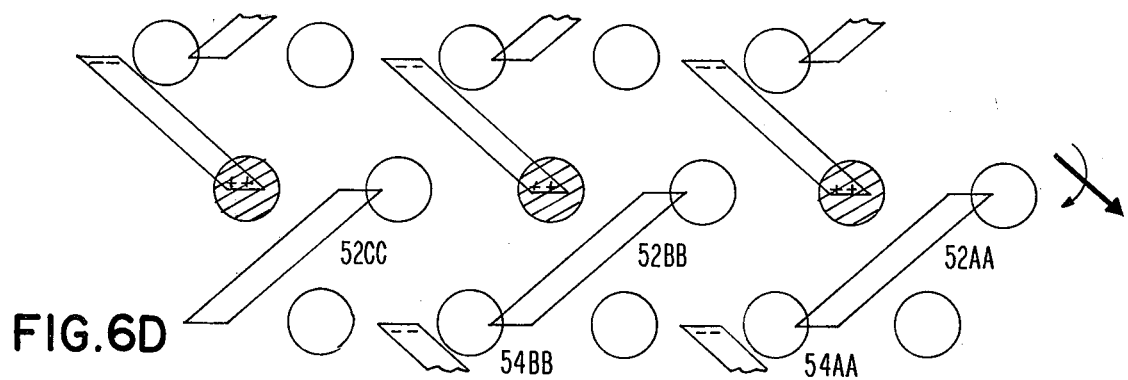

The operation of the field access pattern shown in FIG. 3 is described in FIGS. 6A–6D. In FIG. 6A bubbles in one row are positioned at one end of the elements 52A, 52B, 52C. Bubbles in a second row are positioned at one end of elements 52AA, 52BB, 52CC. As the in-plane magnetic field is rotated 90° as shown in FIG. 6B, the bubbles from the ends of 52A, 52B and 52C move to the ends of elements 54A, 54B and 54C nearest thereto. Similarly the bubbles from the ends of elements 52AA, 52BB and 52CC move to the ends of elements 54AA, 54BB and 54CC (not shown) nearest thereto. The movement of these particular bubbles to the ends of 52AA, BB, CC and 54AA, BB, CC cause the other bubbles in the lattice to move a corresponding amount to maintain the integrity of the lattice. The application of the rotating in-plane magnetic field combines with the lattice bubble-bubble interaction forces to move all the bubbles in the lattice. As the in-plane magnetic field is rotated another 90° as shown in FIG. 6C, bubbles in a third row between the other two rows are attracted to the other end of 52AA, 52BB and 52CC. As the in-plane magnetic field is rotated around 90°, the bubbles in the third row move from the second end of 52AA, 52BB, 52CC to the second end of 54A, 54B and 54C, respectively as shown in FIG. 6D.

In describing the operation of the field access pattern in accordance with this invention, it has been said that each oblong drive element becomes magnetized when the rotating drive field is oriented substantially parallel to the length of the drive element. Bubble domains are attracted by one end of the magnetized element while they are being repelled from the other end of the same element. The field access patterns are designed in such a fashion that whenever the attractive end of a given drive element coincides with a lattice point, the repulsive end of the same element is located halfway between lattice points. While the mechanism of bubble lattice translation has been described based on the interaction between bubble domains and the attractive ends of the drive elements, it is understood that both, the attractive as well as the repulsive ends of the drive elements contribute to the lattice translation mechanism.

Whereas conventional prior art field access patterns operate primarily on the attraction of bubbles to the attractive ends of the magnetized permalloy elements, the field access patterns of this invention utilize both the attractive ends and the repulsive ends of the magnetized permalloy elements.

Although several preferred embodiments of this invention have been described, it is understood that numerous variations may be made in accordance with the principles of this invention.

I claim:

1. The combination of a bubble lattice and a rotating field access pattern suitable for the translation of bubbles, said pattern comprising:

a. a first set of substantially parallel oblong magnetizable elements having a first end positioned on a lattice point and a second end positioned a distance of about 0.5 lattice constant in the direction of translation from a different lattice point, and
   b. a second set of substantially parallel oblong magnetizable elements being oriented substantially perpendicular to said elements of said first set,
   said elements of said second set having a first end positioned a distance of about 0.25 lattice constant in the direction of translation from a lattice point and a second end positioned a distance of about 0.75 lattice constant in the direction of translation from a different lattice point,
   said elements of said first and second sets being distributed over the translation area of said bubble lattice wherein the forces from said elements generated by the application of a rotating in-plane magnetic field will combine with the magnetostatic bubble-bubble interaction forces in the lattice to move the bubble lattice system.

2. The combination as defined in claim 1 wherein the elements of the first set have substantially the same shape as the elements of the second set.

3. The combination as defined in claim 1 wherein the first end of adjacent elements in said first set are separated by 1 lattice constant.

4. The combination as defined in claim 1 wherein the first end of adjacent elements in said first set are separated by 2 lattice constant.

5. The combination as defined in claim 1 wherein the individual elements of said first set cross the individual elements of said second set.

6. The combination as defined in claim 1 wherein the individual elements of said first set are spaced apart from the individual elements of said second set.

7. The combination of a bubble lattice and rotating field access pattern suitable for the propagation of bubbles, said pattern comprising:

a. a first set of oblong magnetizable elements being aligned substantially parallel to each other in a plurality of rows,
   said elements of said first set having a first end positioned on a lattice point in a first row and a second end positioned a distance of about 0.5 lattice constant in the direction of translation from a lattice point in a row other than said first row, and
   b. a second set of oblong magnetizable elements being aligned substantially parallel to each other in a plurality of rows,
   said elements of said second set being oriented substantially perpendicular to said elements of said first set,
   said elements of said second set having a first end positioned a distance of about 0.25 lattice constant in the direction of translation from a lattice point in said first row and a second end positioned a distance of about 0.75 lattice constant in the direction of translation from a lattice point in a row other than said first row,
   said elements of said first and second sets being distributed over the translation area of said bubble lattice wherein the forces from said elements generated by the application of a rotating in-plane magnetic field will combine with the magnetostatic bubble-bubble interaction forces in the lattice to move the bubble lattice system.

8. The combination as defined in claim 7 wherein at least one element in said first set is of a length equal to about 1.3 lattice constant.

9. The combination as defined in claim 7 wherein at least one element in said first set is of length equal to about 2.3 lattice constant.

10. The combination as defined in claim 7 wherein at least one element in said first set is of a length equal to about 3.1 lattice constant.

11. The combination as defined in claim 7 wherein the elements of said first set are separated by an integer multiplicity of the lattice constant.

* * * * *